United States Patent
Takai et al.

(10) Patent No.: US 10,931,287 B1
(45) Date of Patent: Feb. 23, 2021

(54) PHASE LOCKED LOOP CIRCUIT

(71) Applicant: Micron Technology, Inc., Boise, ID (US)

(72) Inventors: Yasuhiro Takai, Sagamihara (JP); Martin Brox, Munich (DE); Mani Balakrishnan, Munich (DE); Maksim Kuzmenka, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/548,778

(22) Filed: Aug. 22, 2019

(51) Int. Cl.
| | |
|---|---|
| H03L 7/06 | (2006.01) |
| H03L 7/087 | (2006.01) |
| H03L 7/18 | (2006.01) |
| H03L 7/07 | (2006.01) |
| H03L 7/113 | (2006.01) |

(52) U.S. Cl.
CPC ............... *H03L 7/087* (2013.01); *H03L 7/07* (2013.01); *H03L 7/113* (2013.01); *H03L 7/18* (2013.01)

(58) Field of Classification Search
CPC . H03L 7/087; H03L 7/18; H03L 7/113; H03L 7/07
USPC .......................................... 327/158
See application file for complete search history.

(56) References Cited

U.S. PATENT DOCUMENTS

| | | | |
|---|---|---|---|
| 9,742,380 B1 * | 8/2017 | Raj ................. | H03K 3/013 |
| 2010/0054760 A1 * | 3/2010 | Fukuda ................. | H04B 10/69 |
| | | | 398/202 |

* cited by examiner

*Primary Examiner* — Metasebia T Retebo
(74) *Attorney, Agent, or Firm* — Dorsey & Whitney LLP (57) ABSTRACT

Disclosed herein is an apparatus that includes a phase frequency detector configured to compare a phase difference between first and second clock signals to generate a phase detection signal, and a slew rate controller configured to lower a slew rate of the first clock signal when a selection signal is in a first state.

18 Claims, 7 Drawing Sheets

PHASE LOCKED LOOP CIRCUIT

BACKGROUND

A memory device such as an HBM (High Bandwidth Memory) sometimes includes a PLL (Phase Locked Loop) circuit in order to generate an internal clock signal synchronous with a reference clock signal to be externally supplied. The PLL circuit sometimes includes a phase frequency detector in order to detect a phase difference and a frequency difference between the reference clock signal and a feedback clock signal. If the slew rate of the reference clock signal supplied to the phase frequency detector is substantially different from the slew rate of the feedback clock signal, an error occurs in a detection operation performed by the phase frequency detector, which results in phase deviation of the internal clock signal and leads to an erroneous operation.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
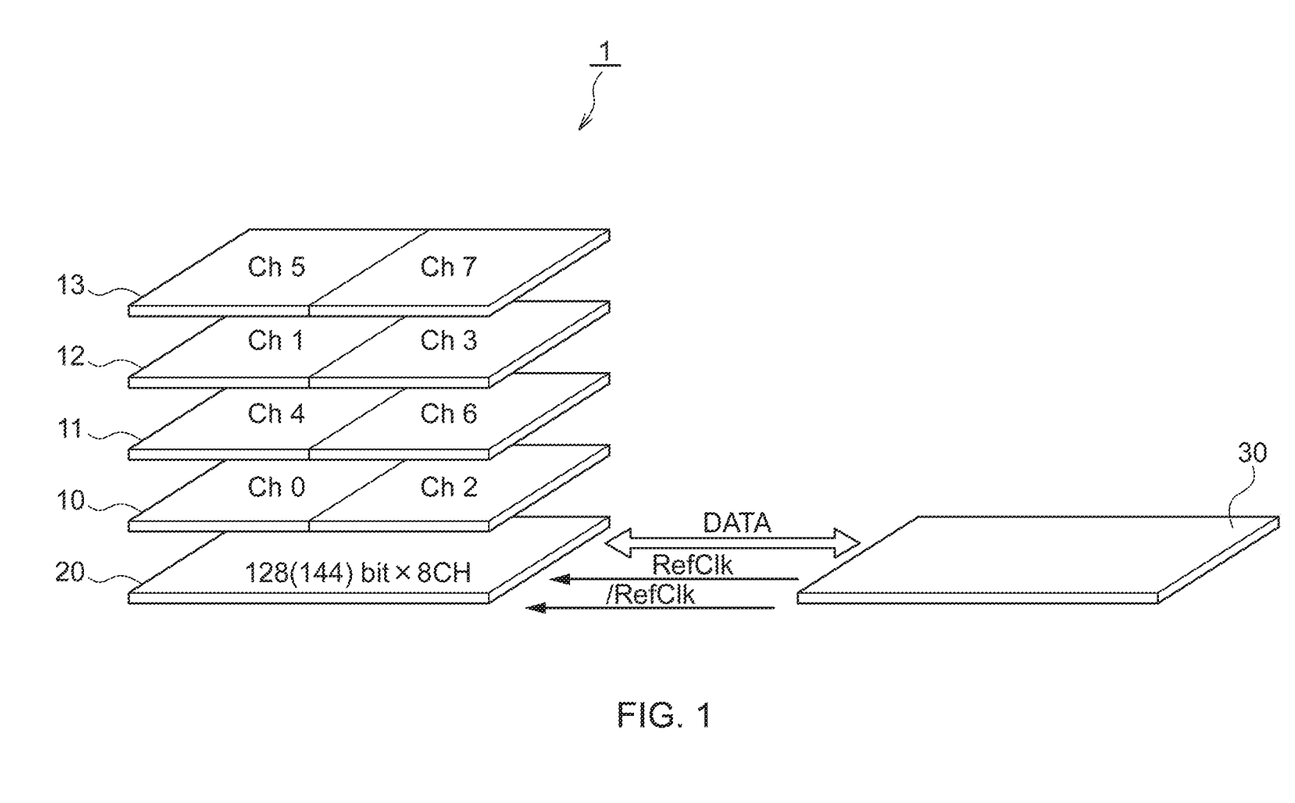
FIG. 1 is a schematic exploded perspective view illustrating an example of a semiconductor device according to the present disclosure.

A semiconductor device 1 shown in FIG. 1 includes a control chip 20 and four memory chips 10 to 13 stacked on the control chip 20. The memory chips 10 to 13 are, for example, DRAMs (Dynamic Random Access Memories). Each of the memory chips 10 to 13 is divided into two channels and the channels can be operated independently of each other. Therefore, terminals such as a data input/output terminal, an address terminal, a command terminal, and a clock terminal are allocated to each of the channels. The memory chip 10 is divided into channels Ch0 and Ch2, the memory chip 11 is divided into channels Ch4 and Ch6, the memory chip 12 is divided into channels Ch1 and Ch3, and the memory chip 13 is divided into channels Ch5 and Ch7. Therefore, the semiconductor device 1 has a configuration including a total of eight channels. The terminals such as the data input terminals, the address terminals, the command terminals, and the clock terminals allocated to the channels Ch0 to Ch7 are connected to the control chip 20 through via conductors provided to penetrate through the memory chips 10 to 13. As an example, the number of I/O bits per one channel is 144 bits where 128 bits are actual data and 16 bits are ECC (Error Correction Code) data.

The control chip 20 is connected to a memory controller 30. The memory controller 30 supplies reference clock signals RefClk and /RefClk complementary to each other to the control chip 20. Upon reception of the reference clock signals RefClk and /RefClk, the control chip 20 generates four-phase internal clock signals Ph0, Ph90, Ph180, and Ph270 shown in FIG. 2. Data transfer between the control chip 20 and the memory controller 30 is performed synchronously with the internal clock signals Ph0, Ph90, Ph180, and Ph270.

Figure 2:
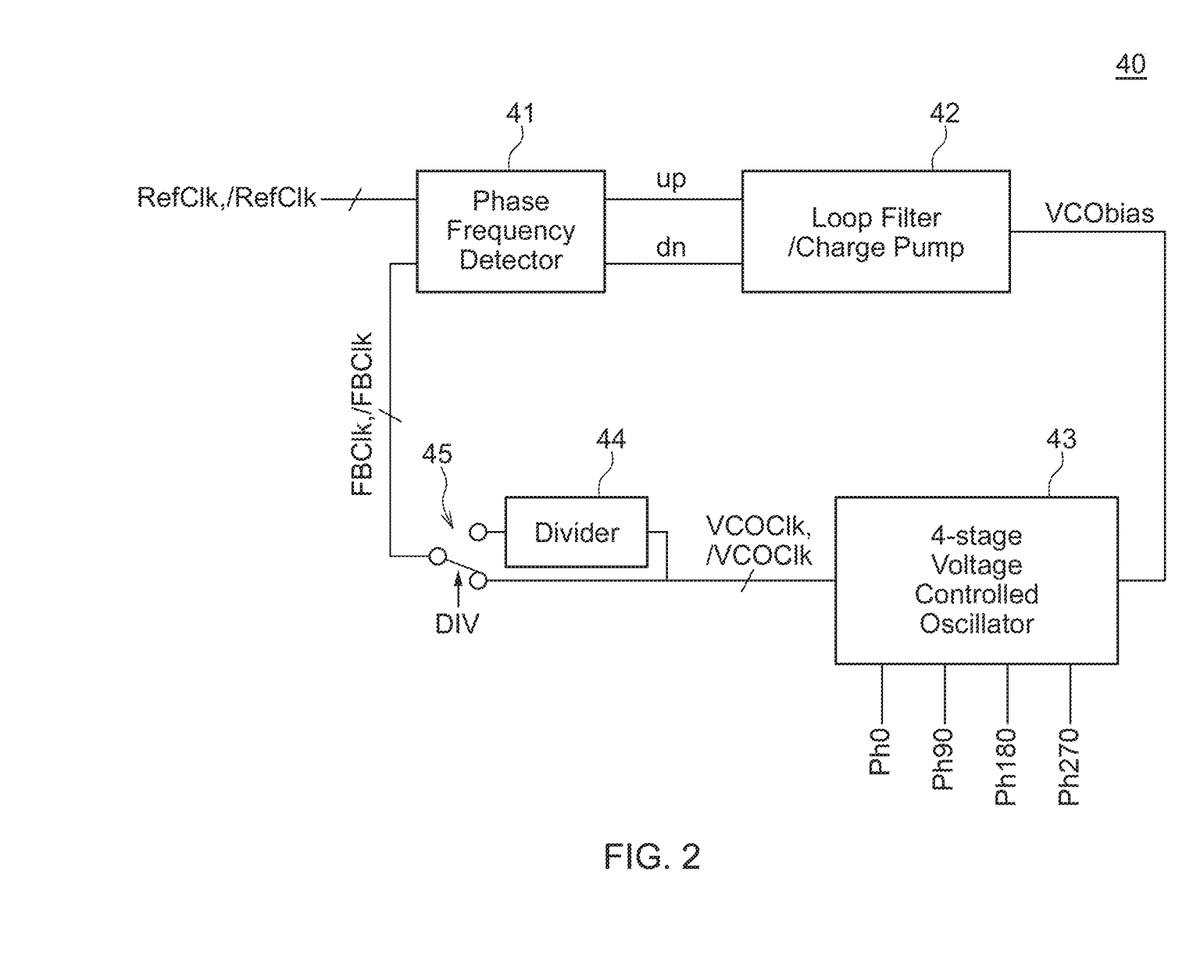
FIG. 2 is a block diagram illustrating a configuration of a PLL circuit according to the present disclosure.

The four-phase internal clock signals Ph0, P90, Ph180, and Ph270 are generated by a PLL circuit 40 shown in FIG. 2. The PLL circuit 40 includes a phase frequency detector 41 that detects a phase difference and a frequency difference between the reference clock signals RefClk and /RefClk and feedback clock signals FBClk and /FBClk, and generates detection signals UP and DN based on the phase difference and the frequency difference. The detection signals UP and DN are supplied to a loop filter/charge pump circuit 42. The loop filter/charge pump circuit 42 averages the detection signals UP and DN to perform charging based on the averaged detection signal UP and perform discharging based on the averaged detection signal DN, thereby changing the level of a bias potential VCObias. The bias potential VCObias is supplied to a VCO (Voltage Controlled Oscillator) circuit 43. The VCO circuit 43 is an oscillator circuit that changes the frequency of output clock signals VCOClk and /VCOClk complementary to each other and the frequency of the four-phase internal clock signals Ph0, Ph90, Ph80, and Ph270 according to the level of the bias potential VCObias. The frequencies of the output clock signals VCOClk and /VCOClk and the internal clock signals Ph0, Ph90, Ph180, and Ph270 are designed to be a predetermined frequency, for example, 800 MHz when the reference clock signals RefClk and /RefClk and the feedback clock signals FBClk and /FBClk are same in the frequency and have a predetermined phase difference. The output clock signals VCOClk and /VCOClk are supplied to a divider circuit 44. The divider circuit 44 divides the output clock signals VCOClk and /VCOClk to generate the feedback clock signals FBClk and /FBClk when a selection signal DIV is active. When the selection signal DIV is deactivated, the divider circuit 44 may stop the division operation.

The PLL circuit 40 further includes a switch circuit 45. The VCO circuit 43, the divider circuit 44, and the switch circuit 45 constitute a clock generation circuit that generates the feedback clock signals FBClk and /FBClk. The switch circuit 45 supplies the feedback clock signals FBClk and /FBClk output from the divider circuit 44 to the phase frequency detector 41 when the selection signal DIV is active, and supplies the output clock signals VCOClk and /VCOClk output from the VCO circuit 43 as they are as the feedback clock signals FBClk and /FBClk to the phase frequency detector 41 when the selection signal DIV is inactive. Therefore, when the selection signal DIV is activated, the frequency of the feedback clock signals FBClk and /FBClk is lowered. For example, in a case where the frequency of the output clock signals VCOClk and /VCOClk generated by the VCO circuit 43 is 800 MHz and the division ratio of the divider circuit 44 is 8, the frequency of the feedback clock signals FBClk and /FBClk is 800 MHz when the selection signal DIV is in an inactive state while the frequency of the feedback clock signals FBClk and /FBClk is lowered to 100 MHz when the selection signal DIV is in an active state. This switching of the frequency of the feedback clock signals FBClk and /FBClk is required because an operation test is sometimes performed using the reference clock signals RefClk and /RefClk with a lower speed than in a practical use.

Figure 3:
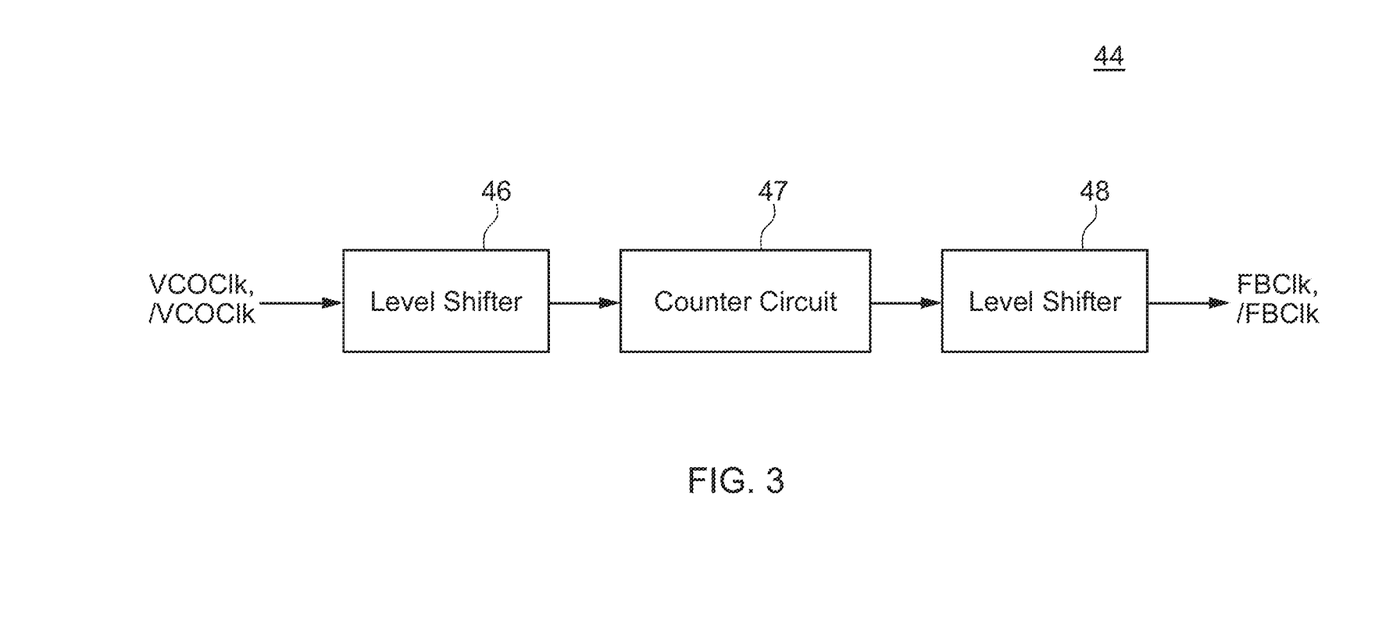
FIG. 3 is a block diagram illustrating a configuration of a divider circuit according to the present disclosure.

A current mode logic (CML) that can output a signal having a small amplitude and a high slew rate is used as a circuit that generates the reference clock signals RefClk and /RefClk, the output clock signals VCOClk and /VCOClk, and the feedback clock signals FBClk and /FBClk. However, the output clock signals VCOClk and /VCOClk are temporarily converted into CMOS (Complementary Metal-Oxide-Semiconductor) levels in the divider circuit 44 to reduce current consumption. For example, in the divider circuit 44 shown in FIG. 3, the output clock signals VCOClk and, /VCOClk being CML levels are converted by a level shifter 46 into CMOS levels, are divided by a counter circuit 47, and then are restored to the CML levels by a level shifter 48. Accordingly, the slew rate of the feedback clock signals FBClk and /FBClk output from the divider circuit 44 is lower than that of the output clock signals VCOClk and VCOClk.

Figure 4:
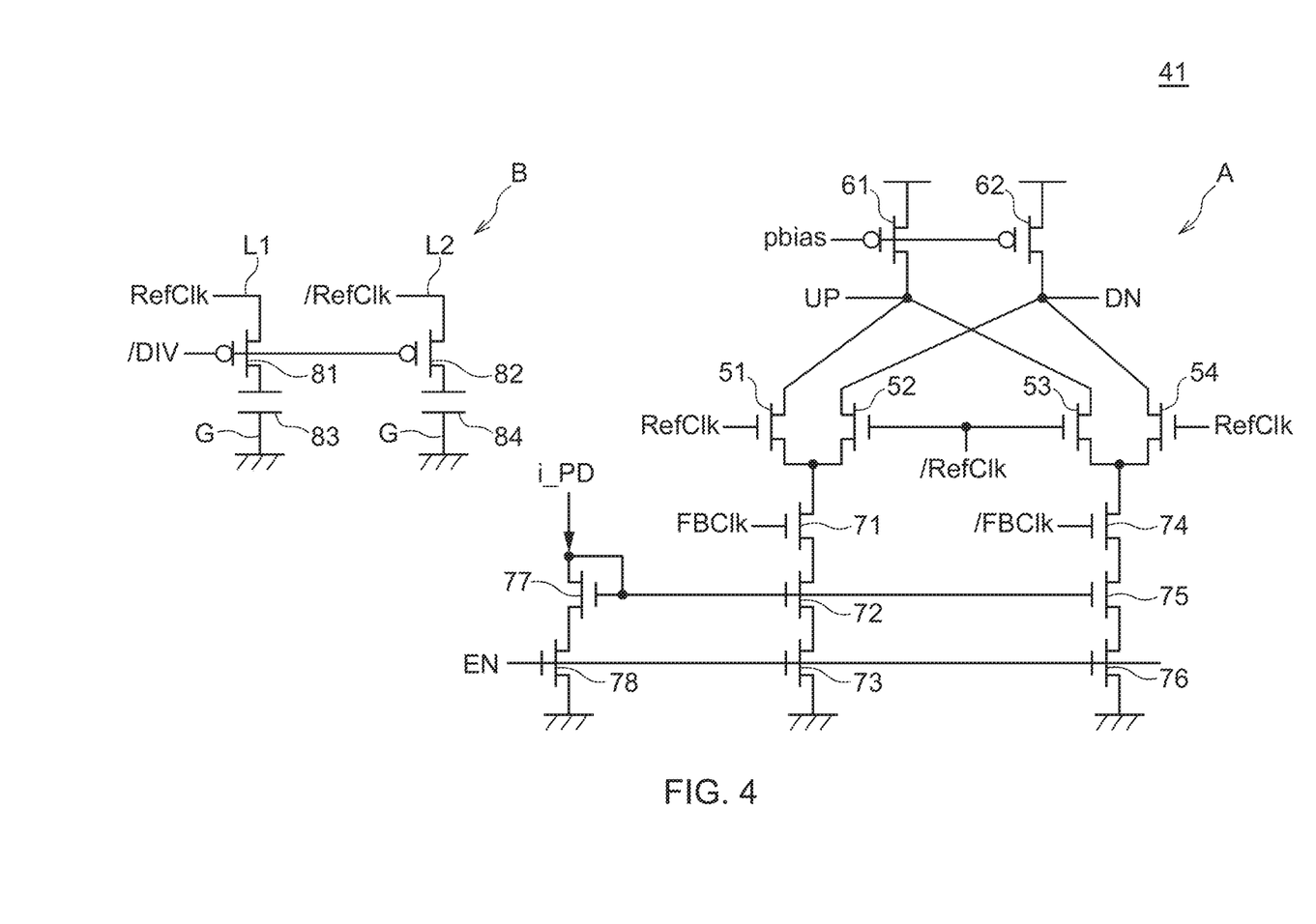
FIG. 4 is a circuit diagram of a phase frequency detector according to a first example of the present disclosure.

As shown in FIG. 4, the phase frequency detector 41 includes a detection unit A and a slew-rate control unit B. The detection unit A includes a differential circuit including N-channel MOS transistors 51 and 52, and a differential circuit including N-channel MOS transistors 53 and 54. The reference clock signal RefClk is input to gate electrodes of the transistors 51 and 54 and the reference clock signal /RefClk is input to gate electrodes of the transistors 52 and 53. Drains of the transistors 51 and 53 are connected in common to a P-channel MOS transistor 61. The potential of a connection point of the transistors 51 and 53 is retrieved as the detection signal UP. Drains of the transistors 52 and 54 are connected in common to a P-channel MOS transistor 62. The potential of a connection point of the transistors 52 and 54 is retrieved as the detection signal DN. A bias potential pbias is supplied to gate electrodes of the transistors 61 and 62.

Sources of the transistors 51 and 52 are connected in common and are grounded via N-channel MOS transistors 71, 72, and 73. Sources of the transistors 53 and 54 are connected in common and are grounded via N-channel MOS transistors 74, 75, and 76. The feedback clock signal FBClk is input to a gate electrode of the transistor 71 and the feedback clock signal /FBClk is input to a gate electrode of the transistor 74. The detection unit A further includes N-channel MOS transistors 77 and 78 connected in series and passing an operation current i_PD. The transistors 77, 72, and 75 constitute a current mirror circuit. Therefore, a current same as the operation current i_PD flowing through the transistor 77 or a current proportional thereto flows through the transistors 72 and 75. An enable signal EN is input to gate electrodes of the transistors 78, 73, and 76. The enable signal EN is deactivated to a low level during a period in which the phase frequency detector 41 is not used.

With the configuration described above, the level of the detection signal UP and the level of the detection signal DN match when the reference clock signals Reflck and /RefClk and the feedback clock signals FBClk and /FBClk have a same frequency and the phase difference therebetween is 90.

On the other hand, when the phase difference between the reference clock signals RefClk and /RefClk and the feedback clock signals FBClk and /FBClk deviates from 90°, a difference occurs between the level of the detection signal UP and the level of the detection signal DN and the level difference increases as the deviation in the phase enlarges. As described above, the detection signals UP and DN are supplied to the loop filter/charge pump circuit 42 to adjust the level of the bias potential VCObias. The VCO circuit 43 changes the frequency of the output clock signals VCOClk and /VCOClk according to the level of the bias potential VCObias to match the frequency of the feedback clock signals FBClk and /FBClk to the frequency of the reference clock signals RefClk and /RefClk and to set the phase difference therebetween to be 90°.

The slew-rate control unit B includes P-channel MOS transistors 81 and 82, and capacitors 83 and 84. The transistor 81 and the capacitor 83 are connected in series between a line L1 supplied with the reference clock signal RefClk and a power supply line G. The transistor 82 and the capacitor 84 are connected in series between a line L2 supplied with the reference clock signal /RefClk and the power supply line G. An inverted selection signal /DIV is input in common to gate electrodes of the transistors 81 and 82. Accordingly, the line L1 is connected to the capacitor 83 and the line L2 is connected to the capacitor 84 in a first state where the selection signal /DIV is at a low level, so that capacitances of the lines L1 and L2 increase and consequently the slew rates of the reference clock signals RefClk and /RefClk lower. Therefore, in this case, the reference clock signals RefClk and /RefClk having lower slew rates are input to the transistors 51 to 54 included in the detection unit A. In contrast thereto, in a second state where the selection signal /DIV is at a high level, the line L1 is disconnected from the capacitor 83 and the line L2 is disconnected from the capacitor 84, so that the slew rates of the reference clock signals RefClk and /RefClk are not substantially lowered. Therefore, in this case, the reference clock signals RefClk and /RefClk having the slew rates not substantially lowered are input to the transistors 51 to 54 included in the detection unit A.

Figure 5A:
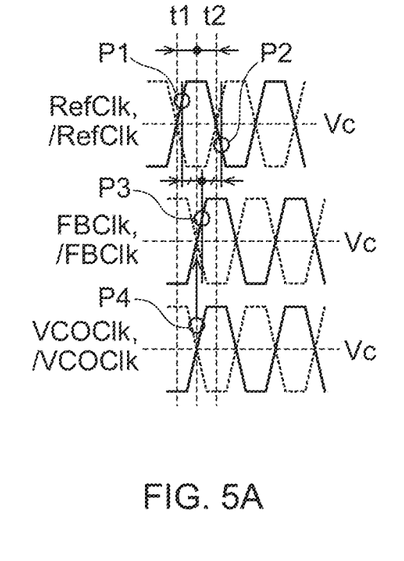
FIG. 5A is a waveform diagram of clock signals when a feedback clock signal bypasses the divider circuit.

In the second state where the selection signal /DIV is at a high level, the PLL circuit 40 is locked when the frequencies of the reference clock signals RefClk and /RefClk, the output clock signals VCOClk and /VCOClk, and the feedback clock signals FBClk and /FBClk match each other and the phase difference between the reference clock signals RefClk and /RefClk and the feedback clock signals FBClk and /FBClk is 90° as shown in FIG. 5A. That is, a time period t1 from a cross-point of the reference clock signals RefClk and /RefClk to a cross-point of the feedback clock signals FBClk and /FBClk and a time period t2 from the cross-point of the feedback clock signals FBClk and /FBClk to a cross-point of the reference clock signals RefClk and /RefClk are same. The level of the cross-points is Vc. Timings P1 and P2 shown in FIGS. 5A and 5B indicate timings when changes of the detection signals UP and DN start and timings when the potential difference between the reference clock signals RefClk and /RefClk has increased by a threshold voltage of the transistors. A timing P3 indicates a timing when the transistor 71 included in the phase frequency detector 41 is turned on and a timing when the phase difference of the feedback clock signals FBClk and /FBClk has increased by the threshold voltage of the transistors. A timing P4 indicates a timing when the feedback clock signals FBClk and /FBClk cross each other. The timing P3 is an exactly intermediate timing between the timing P1 and the timing P2.

Figure 5B:
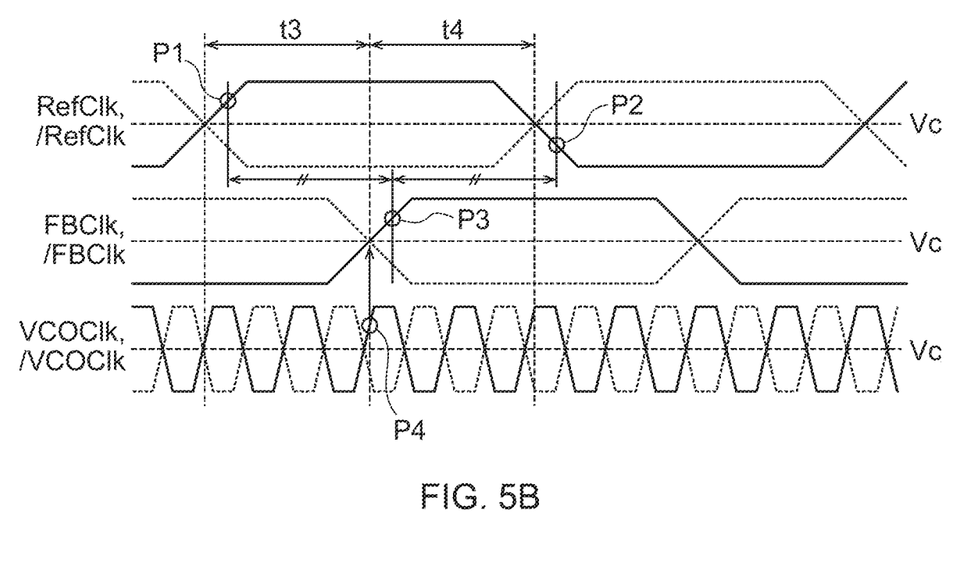
FIG. 5B is a waveform diagram of clock signals when a feedback clock signal passes through the divider circuit.

On the other hand, in the first state where the selection signal /DIV is at a low level, a path passing through the divider circuit 44 is selected and thus the frequency of the reference clock signals RefClk and /RefClk and the feedback clock signals FBClk and /FBClk become lower than the frequency of the output clock signals VCOClk and /VCOClk as shown in FIG. 5B. Also in this case, the PLL circuit 40 is locked when the phase difference between the reference clock signals RefClk and /RefClk and the feedback clock signals FBClk and /FBClk is 90°. That is, a time period 3 from a cross-point of the reference clock signals RefClk and /RefClk and a cross-point of the feedback clock signals FBClk and /FBClk and a time period t4 from the cross-point of the feedback clock signals FBClk and /FBClk and a cross-point of the reference clock signals RefClk and /RefClk are same. The reason is as follows. While the slew rate of the feedback clock signals FBClk and /FBClk is lower than that of the output clock signals VCOClk and /VCOClk in the first state because the feedback clock signals FBClk and /FBClk are generated by the divider circuit 44, the slew rate of the reference clock signals RefClk and /RefClk is also lowered by the slew-rate control unit B and accordingly the both slew rates are ideally same.

Figure 6:
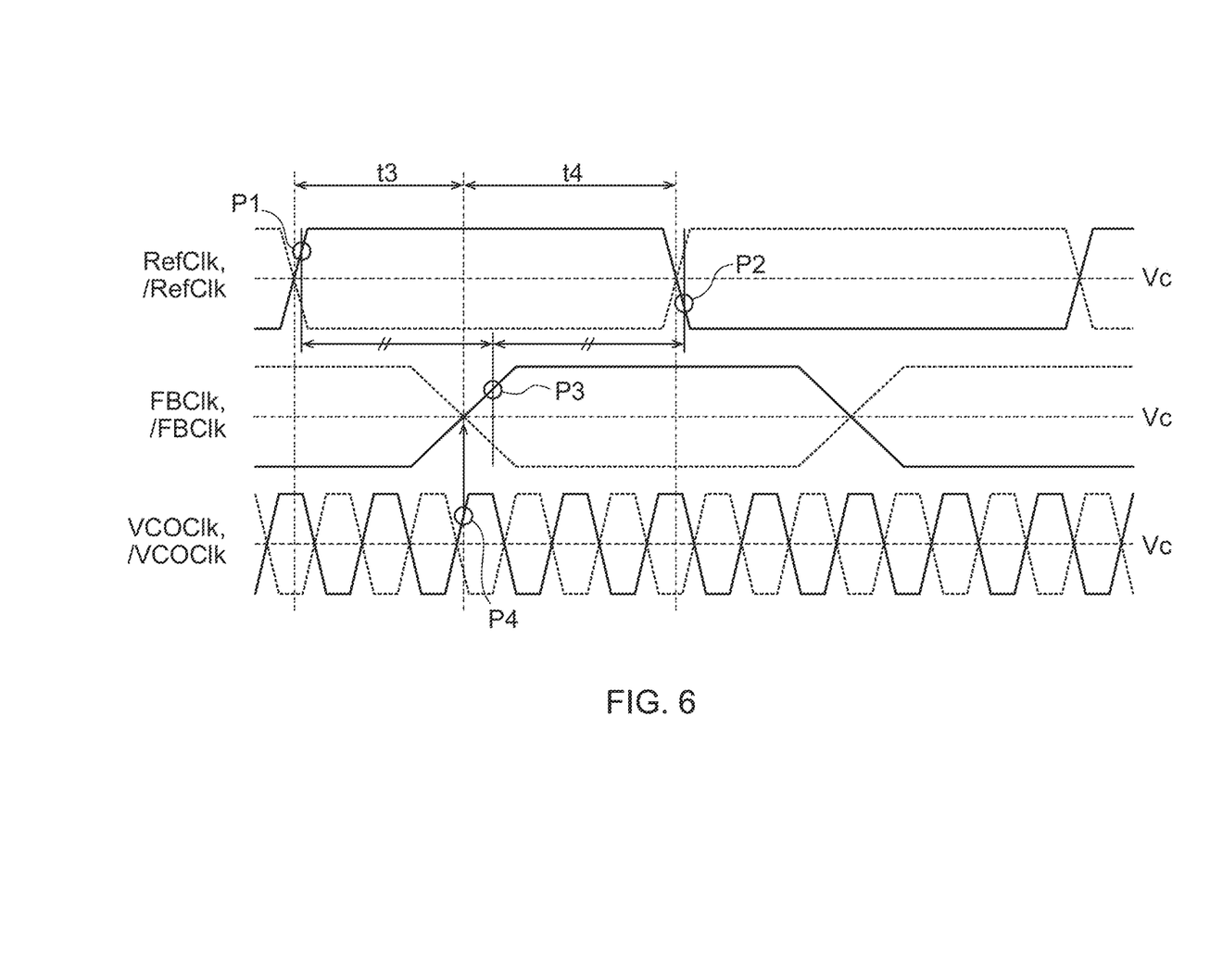
FIG. 6 is a waveform diagram of clock signals according to a reference example.

If the slew-rate control unit B is not provided, the slew rate of the feedback clock signals FBClk and /FBClk becomes lower than that of the reference clock signals RefClk and /RefClk as shown in FIG. 6 when a path passing through the divider circuit 44 is selected. In this case, a difference occurs between the time period t3 from a cross-point of the reference clock signals RefClk and /RefClk to a cross-point of the feedback clock signals FBClk and /FBClk and the time period t4 from the cross-point of the feedback clock signals FBClk and /FBClk to a cross-point of the reference clock signals RefClk and /RefClk. As a result, the condition in which the PLL circuit 40 is locked varies and the phases of the internal clock signals Ph0, Ph90, Ph180, and Ph270 with respect to the reference clock signals RefClk and /RefClk deviate from setting values. In contrast thereto, in the present embodiment, when the frequency of the reference clock signals RefClk and /RefClk externally supplied is low, the slew rate of the reference clock signals RefClk and /RefClk input to the detection unit A is lowered by the slew-rate control unit B and is set to be ideally same as the slew rate of the feedback clock signals FBClk and /FBClk. Therefore, even if the frequency of the reference clock signals RefClk and /RefClk is changed, the phases of the internal clock signals Ph0, Ph90, Ph120, and Ph270 with respect to the reference clock signals RefClk and/RefClk always conform to the setting values.

Figure 7:
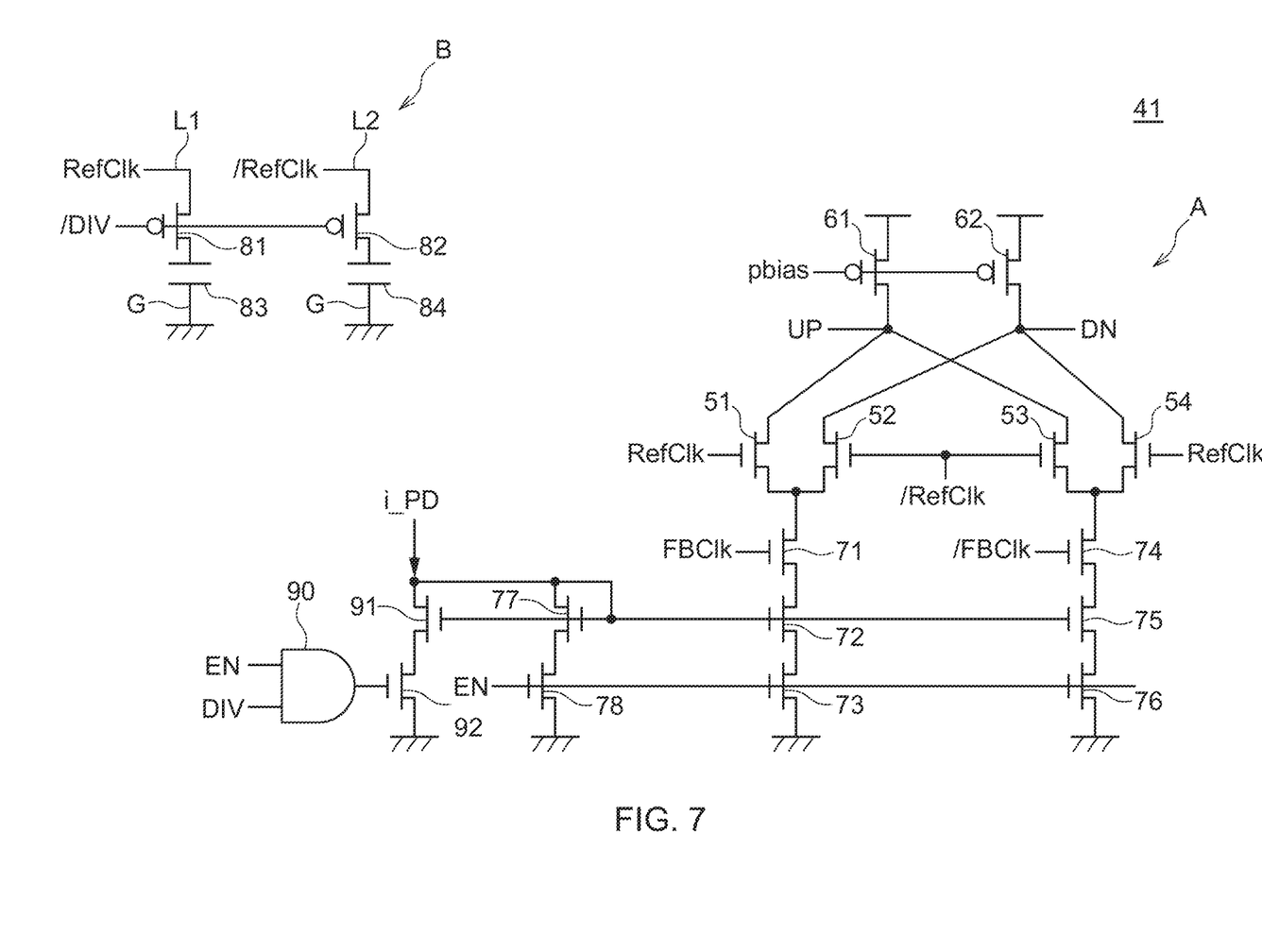
FIG. 7 is a circuit diagram of a phase frequency detector according to a second example of the present disclosure.

N-channel MOS transistors 91 and 92 may be added to an input side of the current mirror circuit as in the phase frequency detector 41 according to a modification shown in FIG. 7. An output signal of an AND gate circuit 90 that receives the enable signal EN and the selection signal DIV is supplied to a gate electrode of the transistor 92. Accordingly, the operation current i_PD is branched to the transistors 77 and 91 in the first state where the selection signal DIV is at a high level and therefore an operation current flowing in the transistors 72 and 75 decreases. For example, when the transistors 77 and 91 have a same gate width, the operation current flowing in the transistors 72 and 75 is halved in the first state where the selection signal DIV is at a high level as compared to the second state where the selection signal DIV is at a low level. Therefore, a waveform distortion occurring in the feedback clock signals FBClk and/FBClk becomes smaller.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
a phase frequency detector configured to compare a phase difference between first and second clock signals to generate a phase detection signal; and
a slew rate controller configured to lower a slew rate of the first clock signal when a selection signal is in a first state, wherein the slew rate controller is configured to pass the first clock signal without lowering the slew rate of the first clock signal when the selection signal is in a second state, wherein the slew rate controller includes a transistor and a capacitor connected in series between a clock signal line supplied with the first clock signal and a power supply line, and
wherein the transistor is brought into an ON state when the selection signal is in the first state, and brought into an OFF state when the selection signal is in the second state.

2. The apparatus of claim 1, wherein the phase frequency detector is configured to decrease an operation current when the selection signal is in the first state.

3. An apparatus comprising:
a phase frequency detector configured to compare a phase difference between first and second clock signals to generate a phase detection signal;
a slew rate controller configured to lower a slew rate of the first clock signal when a selection signal is in a first state, wherein the slew rate controller is configured to pass the first clock signal without lowering the slew rate of the first clock signal when the selection signal is in a second state;
an oscillator circuit configured to generate a third clock signal based on the phase detection signal;
a clock divider configured to generate the second clock signal by dividing the third clock signal when the selection signal is in the first state; and
a switch circuit configured to supply the second clock signal to the phase frequency detector when the selection signal is in the first state.

4. The apparatus of claim 3, wherein the switch circuit is configured to supply the third clock signal to the phase frequency detector as the second clock signal when the selection signal is in the second state.

5. An apparatus comprising:
- a phase frequency detector configured to compare a phase difference between a first clock signal and a second clock signal to generate a phase detection signal;
- a clock generation circuit configured to generate the second clock signal, of which a frequency is controlled to be equal to a frequency of the first clock signal, based on the phase detection signal; and
- a slew rate controller configured to control a slew rate of the first clock signal based on the frequency of the first clock signal.

6. The apparatus of claim 5, wherein the clock generation circuit includes:
- an oscillator circuit configured to generate a third clock signal based on the phase detection signal;
- a clock divider configured to generate a fourth clock signal by dividing the third clock signal when the frequency of the first clock is smaller than a frequency of the third clock signal; and
- a switch circuit configured to transfer the fourth clock signal as the second clock signal to the phase frequency detector when the frequency of the first clock is smaller than a frequency of the third clock signal.

7. The apparatus of claim 6, wherein a slew rate of the fourth clock signal differ from a slew rate of the third clock signal.

8. The apparatus of claim 6, wherein the switch circuit is configured to transfer the third clock signal as the second clock signal to the phase frequency detector when the frequency of the first clock is substantially the same as the frequency of the third clock signal.

9. The apparatus of claim 8, wherein the slew rate controller is configured to control the slew rate of the first clock signal such that the slew rate of the first clock signal when the switch circuit outputs the fourth clock signal as the second clock signal differs from the slew rate of the first clock signal when the switch circuit outputs the third clock signal as the second clock signal.

10. The apparatus of claim 9, wherein the slew rate of the fourth clock signal is lower than the slew rate of the third clock signal.

11. The apparatus of claim 10, wherein the slew rate of the first clock signal when the switch circuit outputs the fourth clock signal as the second clock signal is lower than the slew rate of the first clock signal when the switch circuit outputs the third clock signal as the second clock signal.

12. The apparatus of claim 11, wherein the slew rate of the fourth clock signal is substantially the same as the slew rate of the first clock signal when the switch circuit outputs the fourth clock signal as the second clock signal.

13. The apparatus of claim 8,
- wherein the slew rate controller includes a transistor and a capacitor connected in series between a clock signal line supplied with the first clock signal and a power supply line, and
- wherein the transistor is brought into an ON state when the switch circuit outputs the fourth clock signal as the second clock signal, and brought into an OFF state when the switch circuit outputs the third clock signal as the second clock signal.

14. The apparatus of claim 6, wherein the phase frequency detector is configured to decrease an operation current when the switch circuit outputs the third clock signal as the second clock signal.

15. The apparatus of claim 5, wherein the first clock signal is externally supplied.

16. An apparatus comprising:
- a phase frequency detector configured to compare a phase difference between first and second clock signals; and
- a current control circuit configured to control an operation current of the phase frequency detector based on a slew rate of the first and second clock signals, wherein the current control circuit comprises a first transistor, a second transistor, and a third transistor, wherein the first transistor is configured to provide the operation current, wherein a current the same as the operation current or a current proportional to the operation current flows through the second transistor and third transistor, and wherein a frequency of at least one of the first and second clock signals is adjusted based on the current flowing through the second transistor and the third transistor.

17. The apparatus of claim 16, wherein the current control circuit is configured to control the operation current such that an amount of the operation current is a first amount when the slew rate of the first and second clock signals is a first rate, and that an amount of the operation current is a second amount lower than the first amount when the slew rate of the first and second clock signals is a second rate lower than the first rate.

18. The apparatus of claim 17,
- wherein each of the first and second clock signals has a first frequency when the slew rate of the first and second clock signals is the first rate, and
- wherein each of the first and second clock signals has a second frequency lower than the first frequency when the slew rate of the first and second clock signals is the second rate.

* * * * *